United States Patent [19]

Alter

[11] 4,340,872

[45] Jul. 20, 1982

[54] CONTINUOUSLY VARIABLE PIEZOELECTRIC CRYSTAL DELAY LINE

[75] Inventor: Larry D. Alter, Treasure Island, Fla.

[73] Assignee: E-Systems, Inc., Dallas, Tex.

[21] Appl. No.: 210,630

[22] Filed: Nov. 26, 1980

[51] Int. Cl.³ .................... H03H 9/42; H03H 9/68; H03H 9/38
[52] U.S. Cl. .................... 333/152; 333/150
[58] Field of Search ............ 333/150–155, 333/193–196, 141–149, 188–189, 191–192; 310/313 R, 313 A, 313 B, 313 C, 313 D; 330/5.5; 331/107 A

[56] References Cited

U.S. PATENT DOCUMENTS

| | | | |
|---|---|---|---|
| 2,762,984 | 9/1956 | Berkley | 333/152 |
| 3,293,557 | 12/1966 | Denton | |
| 3,536,506 | 10/1970 | Fraser | 133/155 X |
| 3,568,079 | 3/1971 | Yoder | 333/150 X |
| 3,568,080 | 3/1971 | Troutman | 333/154 X |
| 3,684,970 | 8/1972 | Wang | 333/154 X |
| 3,710,465 | 1/1973 | Thomann | 333/152 X |
| 3,713,049 | 1/1973 | Desormiere | 333/102 |
| 3,723,915 | 3/1973 | Adler et al. | 333/152 |
| 3,731,214 | 5/1973 | Bers | 333/150 X |
| 3,821,667 | 6/1974 | Thomann | 333/152 |
| 3,840,826 | 10/1974 | Toda et al. | 333/144 |
| 3,894,286 | 7/1975 | Armstrong | 333/155 |
| 3,916,348 | 10/1975 | Toda et al. | 310/313 B X |
| 4,019,074 | 4/1977 | Shibayama et al. | 252/62.9 |
| 4,037,175 | 7/1977 | Kansy et al. | 333/152 |
| 4,088,969 | 5/1978 | Crowley et al. | 333/153 |
| 4,128,615 | 12/1978 | Tournois et al. | 333/153 X |
| 4,134,623 | 4/1977 | Shibayama et al. | 310/313 |

*Primary Examiner*—Marvin L. Nussbaum
*Attorney, Agent, or Firm*—Robert V. Wilder; Albert M. Crowder, Jr.

[57] ABSTRACT

A continuously variable delay line (10) includes a piezoelectric crystal (12) having an input transducer (14) and an output transducer (16). An input signal is transmitted through input lines (18) to the input transducer (14) and received through output lines (20) from the output transducer (16). The input signal is converted to a surface acoustic wave for transmission across the surface of crystal (12). Control electrodes (22 and 24) are applied to surfaces of the crystal (12) and are connected to control lines (26). A control signal is applied to the control lines (26) to apply an electric field to the crystal (12). The electric field thus applied alters the longitudinal dimensional characteristic of the crystal (12) and thereby controls the propagation distance between the input transducer (14) and the output transducer (16). By varying the propagation distance between the transducers (14, 16) the control signal continuously varies the propagation delay of a signal as it is transmitted across the surface of the crystal (12). Thus, the time delay between the input and output lines is a function of the control signal applied to lines (26).

2 Claims, 6 Drawing Figures

CONTINUOUSLY VARIABLE PIEZOELECTRIC CRYSTAL DELAY LINE

TECHNICAL FIELD

The present invention pertains to electronic delay lines and in particular to such a delay line utilizing a surface acoustic wave device.

BACKGROUND ART

Numerous signal processing applications, such as adaptive antennas and radar, require the use of electronic delay lines. A number of types of crystal delay lines have heretofore been used for this purpose. Adjustable time delays have been provided by switching between devices each having a different fixed delay or by switching between taps of a single device having a multitap delay line. These delay lines suffer the disadvantage that the delay is incremented in finite steps which results in poor signal resolution or an exceedingly complex device with a large number of taps. A further type of crystal delay line has used dispersive transducers to vary the delay along the crystal as a function of the input signal frequency. A delay line of this type requires frequency converters at the input and output transducers. This approach does not work well with a large percentage bandwidth signal or with narrowband signals which can be received over a wide tunable bandwidth. A further approach has been the use of a controlled poling field across the propagation path of a surface acoustic wave device to vary the phase velocity of the surface waves. This approach, however, has provided only a very limited variation in time delay even with a strong poling field.

Therefore, there exists a need for a continuously variable electronic delay line which has a relatively large bandwidth, a substantial variation in time delay and continuous adjustment over the time delay range.

DISCLOSURE OF THE INVENTION

The present invention comprises a continuously variable time delay line which includes a piezoelectric crystal having an input transducer mounted on a surface of the crystal and connected to receive an input signal for generating surface acoustic waves therefrom. The waves thus generated are transmitted along the surface of the crystal. An output transducer is mounted on the surface of the crystal offset from the input transducer to receive the surface acoustic waves from the device. Control electrodes are mounted on the crystal at spaced apart positions and the control electrodes are connected to receive a control signal. The control signal applies an electric field to the crystal to alter the spacing between the transducers due to piezoelectric expansion. The controlled expansion of the crystal alters the transit time between the transducers and therefore varies the time delay of the signal between the input and output transducers.

BRIEF DESCRIPTION OF THE DRAWINGS

For a more complete understanding of the present invention and the advantages thereof, reference is now made to the following Description taken in conjunction with the accompanying Drawings in which.

DETAILED DESCRIPTION

Figure 1:
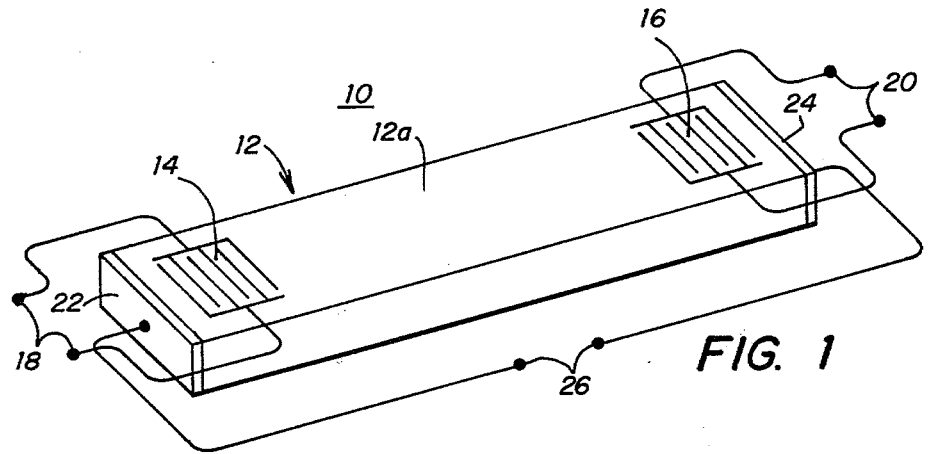
FIG. 1 is a perspective view of a continuously variable delay line comprising a surface wave device having input and output transducers mounted on the upper surface thereof and control electrodes connected to opposing ends of the device.

A continuously variable electronic delay line in accordance with the present invention is illustrated in FIG. 1. A delay line 10 has a piezoelectric crystal body 12 which has an input transducer 14 and an output transducer 16 mounted on the upper surface 12a of the crystal. The input transducer 14 is connected to input lines 18 and the output transducer 16 is connected to output lines 20.

The crystal 12 has control electrodes 22 and 24 mounted at opposite ends thereof in alignment with the transducers 14 and 16. The electrodes 22 and 24 are connected to control lines 26.

The transducers 14 and 16 and the electrodes 22 and 24 are preferably fabricated on the crystal 12 as deposited metallization.

The transducers 14 and 16 comprise interdigitated fingers which are connected in alternate groups to the corresponding input and output lines.

In operation, an input signal is applied through lines 18 to the input transducer 14. The electromagnetic signal is converted to surface waves which are propagated along the surface 12a of the piezoelectric crystal 12. At the output transducer 16 the surface waves are converted into an electromagnetic signal which is transmitted through the output lines 20. The output signal through lines 20 corresponds to the input signal but is delayed by the time required for the surface waves to propagate from the input transducer 14 to the output transducer 16.

A control signal is applied to lines 26 and thereby to electrodes 22 and 24. The voltage on the electrodes 22 and 24 applies an electromagnetic field to the crystal 12. The field thus applied alters the dimensional characteristics of the crystal by the plezoelectric effect. The amplitude of the control signal controls the length of the crystal 12 and thereby the propagation distance between the input and output transducers 14 and 16. Thus, the time delay between the input and output signals is a function of the amplitude of the control signal applied to lines 26.

In a typical design for a delay line as illustrated in FIG. 1 in accordance with the present invention, the input signal applied to lines 18 is at a frequency of 300 MHZ with a bandwidth of 10 MHZ. The time delay for the signal is adjustable between 10 and 10.05 microseconds with a control signal that varies in amplitude between 0 and $10^6$ volts/cm. A crystal 12 for use in this application is Lithium Niobate $L_iNBO_3$ crystal and has a length of 2", a width of ½" and a thickness of ¼".

Figure 2:
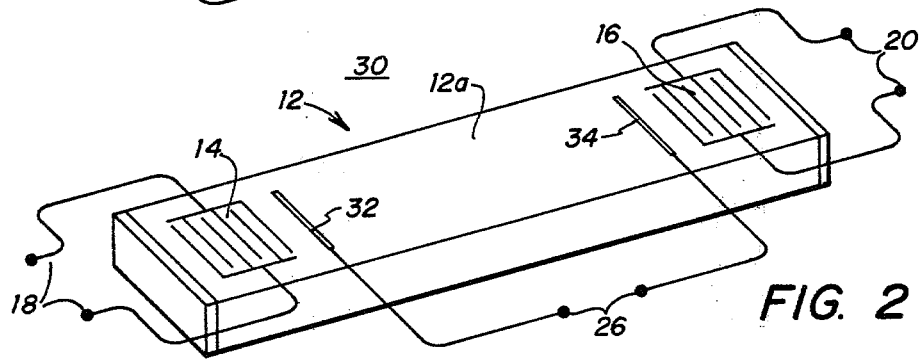
FIG. 2 is a delay line similar to that shown in FIG. 1 but with the control electrodes connected to the device in the region between the input and output transducers.

A further embodiment 30 of a delay line in accordance with the present invention is illustrated in FIG. 2. This embodiment is similar to that shown in FIG. 1 but with a different placement of the control electrodes. Delay line 30 has control electrodes 32 and 34 connected to control line 26 and fabricated on the surface 12a of crystal 12 between transducers 14 and 16. Upon receipt of a control signal the control electrodes 32 and 34 alter the dimensional characteristics of the crystal 12 in the region between the control electrodes. The alteration in dimension serves to change the propagation distance between the input transducer 14 and output transducer 16 to thereby control the time delay between the input and output signals. The electrodes 32 and 34 somewhat attenuate the surface waves transmitted between the transducers. However, the embodiment illustrated in FIG. 2 has the advantage that the transducers 14 and 16 are not affected by the application of the control signal as is the case for the embodiment illustrated in FIG. 1. In FIG. 2 the resonant bandwidth and center frequency of the transducers is not affected by the control signal applied to lines 26. Otherwise, the delay line 30 functions in the same manner as described above for delay line 10.

Figure 3:
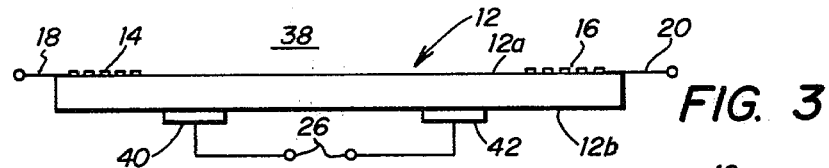
FIG. 3 is an elevation view of a delay line similar to that shown in FIG. 1 but which has the control electrodes mounted on the lower surface of the device opposite the surface having the transducers mounted thereon.

A further embodiment 38 of the present invention is illustrated in FIG. 3. The delay line 38 is essentially the same as the delay line 10 illustrated in FIG. 1 but with a change in the placement of the control electrodes. In delay line 38 the control electrodes 40 and 42 are placed on a surface 12b of crystal 12. Surface 12b is on the opposite side of surface 12a of the crystal 12. Electrodes 40 and 42 are likewise connected to control lines 26 for receiving a control signal.

When a control signal is applied to electrodes 40 and 42 the electric field produced penetrates to the interior of the crystal 12 to produce bulk mode piezoelectric expansion to alter the distance between the transducers 14 and 16. The electrode configuration for delay line 38 eliminates the electrode interference problem as noted for the delay line 30 described in FIG. 2.

Figure 4:
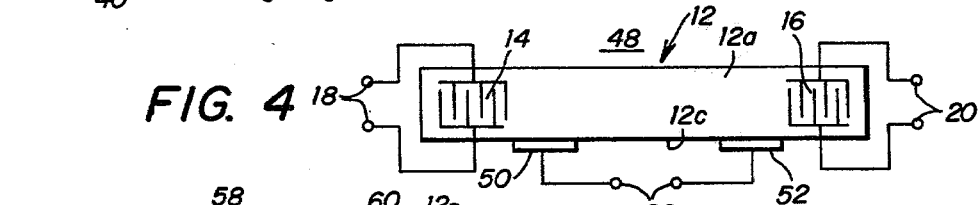
FIG. 4 is a plan view of a delay line similar to that shown in FIG. 1 but having the control electrodes mounted on a side surface of the device.

A further embodiment of the present invention is a time delay line 48 which is illustrated in FIG. 4. Delay line 48 is essentially the same as delay line 10 illustrated in FIG. 1 with the exception of the placement of the control electrodes. The delay line 48 is provided with control electrodes 50 and 52 which are placed on a surface 12c of the crystal 12. Surface 12c is a side of the crystal 12 and is perpendicular to the surface 12a which has the transducers 14 and 16 mounted thereon. The control electrodes 50 and 52 are connected to receive a control signal through the control lines 26. The control electrodes 50 and 52 produce a bulk mode piezoelectric expansion of crystal 12 to control the longitudinal dimension of the crystal. When a control signal is applied to lines 26 the longitudinal dimension of crystal 12 is varied to alter the propagation distance between the input and output transducers. Thus, for the delay line 48 the magnitude of the delay is a function of the amplitude of the control signal applied to the control lines 26.

Figure 5:
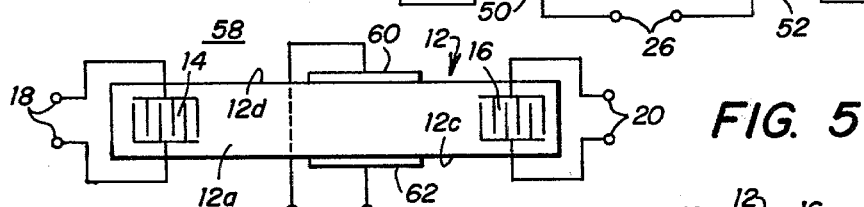
FIG. 5 is a plan view of a delay line similar to that shown in FIG. 1 but having the control electrodes mounted on opposite sides of the device.

A further embodiment of the time delay line of the present invention is illustrated in FIG. 5. A delay line 58 is essentially the same as the delay line 10 illustrated in FIG. 1 but with a different placement of the control electrodes. Delay line 58 includes control electrodes 60 and 62 which are placed on opposite sides 12c and 12d of the crystal 12. The surfaces of sides 12c and 12d are perpendicular to the surface 12a of crystal 12. The piezoelectric crystal 12 utilized in the time delay line 58 has an especially strong cross coupling between the transverse and longitudinal axes. The electric field generated by the electrodes 60 and 62 is applied transversely to the crystal 12 but due to the cross coupling the longitudinal dimension varies as the function of the control voltage applied to the electrodes. Thus, as the control signal varies in amplitude the propagation distance between the transducers 14 and 16 likewise varies to give a continuously variable delay time between the input signal and output signal of delay line 58.

Figure 6:
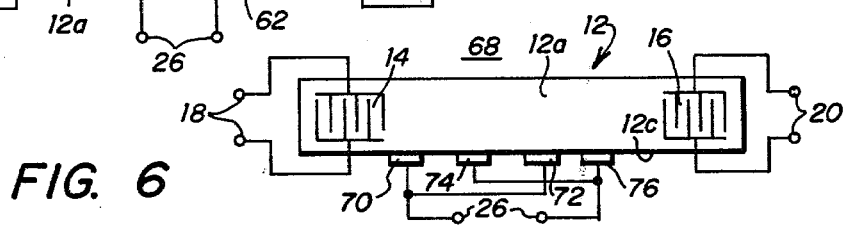
FIG. 6 is a plan view of a delay line similar to that shown in FIG. 1 but having a plurality of pairs of control electrodes mounted on a side of the surface wave device.

A still further embodiment 68 of the present invention is illustrated in FIG. 6. The delay line 68 is similar to the delay line 10 illustrated in FIG. 1 but differs in the placement of the control electrodes. A first of the control lines 26 is connected to electrodes 70 and 72 while a second of the control lines is connected to electrodes 74 and 76. The delay line 68 has a multiple control electrode configuration which increases the electric field strength generated by a given amplitude of control signal such that a lesser amplitude control voltage can be used to produce a given time delay. This control electrode configuration is essentially the same as that shown for delay line 48 in FIG. 4. However, multiple control electrodes, as shown for delay line 68, can be used with any of the electrode configurations for the delay lines shown in FIGS. 2–4.

In summary, the present invention comprises a continuously variable delay line which utilizes a piezoelectric crystal. Control electrodes are mounted on the crystal to receive a control signal which applies an electric field to the crystal. The electric field causes a dimensional change in the crystal to alter the propagation distance between the input and output transducers. Thus, the delay time of a signal transmitted as surface waves across the crystal is controlled as a function of the control voltage. The delay time is thereby continuously variable in accordance with the control voltage.

Although several embodiments of the invention have been illustrated in the accompanying drawings and described in the foregoing Detailed Description, it will be understood that the invention is not limited to the embodiments disclosed, but is capable of numerous rearrangements, modifications and substitutions without departing from the scope of the invention.

I claim:

1. A continuously variable time delay comprising: a piezoelectric crystal, an input transducer mounted on a surface of said crystal and connected to receive an input signal for generating surface acoustic waves therefrom, said waved transmitted along the surface of said crystal, an output transducer mounted on said surface offset from said input transducer to receive said surface acoustic waves, and an output transducer mounted on said surface offset from said input transducer to receive said surface offset from said input transducer to receive said surface acoustic waves, and control electrodes mounted on a surface of said crystal opposite the surface having said transducers mounted thereon said control electrodes connected to receive a control signal which applies a field to said crystal to alter the spacing between said transducers due to piezoelectric expansion of said crystal and thereby control the transit time between said transducers.

2. A continuously variable time delay comprising: a piezoelectric crystal, an input transducer mounted on a surface of said crystal and connected to receive an input signal for generating surface acoustic waves therefrom, said waves transmitted along the surface of said crystal, an output transducer mounted on said surface offset from said input transducer to receive said surface acoustic waves, and control electrodes mounted on said crystal normal to the surface having said transducers mounted thereon said control electrodes connected to receive a control signal which applies a field to said crystal to alter the spacing between said transducers due to piezoelectric expansion of said crystal and thereby control the transit time between said transducers.

* * * * *